(12) United States Patent
Breems (10) Patent No.: US 9,143,158 B2
(45) Date of Patent: Sep. 22, 2015

(54) SIGMA-DELTA MODULATOR

(71) Applicant: NXP B.V., Eindhoven (NL)

(72) Inventor: Lucien Johannes Breems, Eindhoven (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/268,409

(22) Filed: May 2, 2014

(65) Prior Publication Data

US 2014/0333462 A1    Nov. 13, 2014

(30) Foreign Application Priority Data

May 10, 2013    (EP) ..................................... 13167373

(51) Int. Cl.
    *H03M 3/00*     (2006.01)

(52) U.S. Cl.
    CPC ................ *H03M 3/39* (2013.01); *H03M 3/412* (2013.01); *H03M 3/42* (2013.01); *H03M 3/454* (2013.01)

(58) Field of Classification Search
    CPC ....... H03M 3/43; H03M 3/454; H03M 3/406; H03M 3/452; H03M 7/304; H03M 3/424; H03M 7/3026; H03M 7/3037; H03M 1/0692; H03M 1/403; H03M 3/022
    USPC .......................................... 341/118, 120, 143
    See application file for complete search history.

(56) References Cited

U.S. PATENT DOCUMENTS

| | | | | |
|---|---|---|---|---|
| 5,719,573 A | * | 2/1998 | Leung et al. | 341/143 |
| 5,742,246 A | * | 4/1998 | Kuo et al. | 341/143 |
| 6,809,672 B2 | * | 10/2004 | Gupta | 341/143 |
| 7,262,726 B2 | * | 8/2007 | Schreier et al. | 341/143 |
| 7,362,252 B1 | * | 4/2008 | Pai | 341/143 |
| 7,649,480 B2 | * | 1/2010 | Boomer et al. | 341/120 |
| 7,714,675 B2 | * | 5/2010 | Wang | 332/109 |
| 8,411,980 B1 | * | 4/2013 | Wang et al. | 382/254 |
| 8,643,524 B1 | * | 2/2014 | Zanbaghi | 341/143 |
| 2002/0175846 A1 | * | 11/2002 | Sakimura | 341/143 |
| 2002/0180629 A1 | | 12/2002 | Liu et al. | |
| 2005/0052299 A1 | * | 3/2005 | Oliaei | 341/143 |
| 2005/0156771 A1 | * | 7/2005 | Melanson | 341/143 |
| 2011/0050475 A1 | | 3/2011 | Straeussnigg et al. | |
| 2011/0156940 A1 | * | 6/2011 | Le Guillou et al. | 341/143 |
| 2011/0200152 A1 | * | 8/2011 | Belot et al. | 375/350 |
| 2013/0259103 A1 | * | 10/2013 | Jensen | 375/219 |

OTHER PUBLICATIONS

Norsworthy, S., et al; "Delta-Sigma Data Converters (Theory, Design, and Simulation)"; Wiley, New York, NY; p. 6 and 178 (1996).
Bolatkale, Muhammed, et al; "A 4 GHz CT ΔΣ ADC with 70 dB DR and 74 dBFS THD in 125 MHz BW"; IEEE Journal of Solid-State Circuits, vol. 46, No. 12; pp. 470-472 (Dec. 2011).
Extended European Search Report for application No. 13167373.3 (Mar. 5, 2014).

* cited by examiner

*Primary Examiner* — Linh Nguyen (57) ABSTRACT

A sigma-delta modulator (300) comprising a first filter stage (304); a second filter stage (306) in series with the first filter stage (304); a first feedback path (311) between the output of the second filter stage (306) and the input to the second filter stage (306), the first feedback (311) comprising a first gain stage (308, 308') such that the first feedback path (311) is configured to provide a first gain value; and a second feedback path (313) between the output of the second filter stage (306) and the input to the first filter stage (304), the second feedback path (313) comprising a second gain stage (309; 310') such that the second feedback path (313) is configured to provide a second gain value. The first gain value is different to the second gain value.

15 Claims, 5 Drawing Sheets

SIGMA-DELTA MODULATOR

CROSS-REFERENCE TO RELATED APPLICATIONS

This application claims the priority under 35 U.S.C. §119 of European patent application no. 13167373.3, filed on May 10, 2013, the contents of which are incorporated by reference herein.

The present disclosure relates to sigma-delta modulators.

According to a first aspect of the present invention there is provided a sigma-delta modulator comprising:
a first filter stage;
a second filter stage in series with the first filter stage;
a first feedback path between the output of the second filter stage and the input to the second filter stage, the first feedback path comprising a first gain stage such that the first feedback path is configured to provide a first gain value; and
a second feedback path between the output of the second filter stage and the input to the first filter stage, the second feedback path comprising a second gain stage such that the second feedback path is configured to provide a second gain value;
wherein the first gain value is different to the gain of the second gain value.

Distributing the gain across the feedback paths in this way enables a sigma-delta modulator to operate at high speeds or at low powers without suffering from meta stability problems The first gain value may be less than the second gain value. A time delay associated with the first feedback path may be less than a time delay associated with the second feedback path.

The first gain stage may comprise a first limiting amplifier, and the second gain stage may comprise the first limiting amplifier and a second limiting amplifier in series. The first gain stage may not include the second limiting amplifier. The gain of the second limiting amplifier may be greater than the gain of the first limiting amplifier.

The first gain stage may be independent of the second gain stage. The first gain stage may comprise a first limiting amplifier, and the second gain stage may comprise a second limiting amplifier. The second gain stage may not include the first limiting amplifier.

The second gain value may be an order of magnitude greater than the first gain value. The first gain value may be 1.

The first feedback path and/or the second feedback path may be configured to provide negative feedback.

The sigma-delta modulator may further comprise: an input terminal; a main adder having a first input, a second input and an output; an intermediate adder having a first input, a second input and an output; and an output terminal. The input terminal may be coupled to the first input of the main adder. The output of the main adder may be coupled to an input of the first filter stage. The output of the first filter stage may be coupled to the first input of the intermediate adder. The output of the intermediate adder may be coupled to an input of the second filter stage. The output of the second filter stage may be coupled to an input of the first gain stage. The output of the first gain stage may be coupled to the second input of the intermediate adder. The output of the second filter stage may also be coupled to an input of the second gain stage either directly or indirectly (for example, indirectly via the first gain stage). The output of the second gain stage may be coupled to the second input of the main adder. The output of the second gain stage may also be coupled to the output terminal.

The first inputs to the main and intermediate adders may be positive inputs and the second inputs to the main and intermediate adders may be negative inputs. In this way negative feedback can be provided. Alternatively, positive feedback can be provided.

The second feedback path may comprise a second feedback component coupled between the output of the second gain stage and the input of the first filter stage. The second feedback component may be a digital to analogue converter.

The first feedback component may comprise a first feedback component coupled between the output of the first gain stage and the input of the second filter stage. The first feedback component may be a digital to analogue converter.

There may be provided a sigma-delta modulator comprising a loop filter in a forward path of the sigma-delta modulator and a quantizer in a feedback path of the sigmadelta modulator. The quantizer may have a plurality of gain stages. The outputs of the plurality of gain stages may be each coupled to different loop filter nodes in the loop filter in order to define a plurality of feedback paths in the sigma-delta modulator, wherein each feedback path is configured to provide a different gain.

There may be provided a very high-speed sigma-delta modulator comprising any sigma-delta modulator disclosed herein. A very high-speed modulator can be considered as one that operates at frequencies in excess of 1 GHz, 5 GHz, or 10 GHz, as non-limiting examples.

There may be provided a very low-power sigma-delta modulator comprising any sigma-delta modulator disclosed herein. Such a sigma-delta modulator need not necessarily operate at a very high sampling rate.

There may be provided an integrated circuit comprising any sigma-delta modulator disclosed herein.

Embodiments of the present invention will now be described by way of example and with reference to the accompanying drawings in which.

Figure 1:
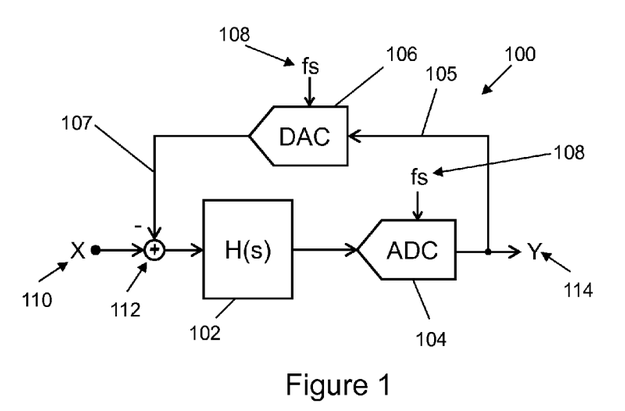
FIG. 1 illustrates a block diagram of a sigma-delta modulator.

FIG. 1 illustrates a block diagram of a sigma-delta modulator 100. The modulator 100 is a feedback system consisting of an adder 112, a loop filter (H(s)) 102, a quantizer or analogue-to-digital converter (ADC) 104 and a digital-to-analogue converter (DAC) 108. An input X 110 is coupled to a positive input of the adder 112. The output of the adder 112 is coupled to an input of the loop filter (H(s)) 102. The output of the loop filter (H(s)) 102 is coupled to an input of the ADC 104. An output of the ADC 104 is the output Y 114 of the modulator 100.

In order to provide the feedback loop, the output of the quantizer 104 is also coupled to an input of the DAC 106. The output of the DAC 106 is coupled to a negative input of the adder 112 to provide a feedback signal 107.

The quantizer 104 and the DAC 106 are both clocked by a clock signal 108 that has a sampling frequency fs. Typically the sampling frequency may be higher than the minimum required Nyquist rate such that the modulator 100 is oversampled.

Due to the presence of feedback, the loop filter 102, and the fact that a sigma-delta modulator 100 is usually highly oversampled, the quantization error of the modulator 100 in the signal band of interest is shaped according to the inverse of the loop filter 102 characteristic. Also, the quantization error of the quantizer ADC 104 is suppressed in the frequency region where the gain of the loop filter 102 is high. At frequencies where the gain of the loop filter 102 decreases, the quantization noise increases. However, a digital decimation filter (not shown) can be placed at the output of the sigma-delta modulator 100 to filter out the out-of-band quantization noise such that very high resolutions can be achieved in relatively small bandwidths. This noise-shaping technique can be so effective that even with a 1-bit quantizer ADC 104, 16 or more bits of resolution can be achieved after decimation filtering.

However, as a sigma-delta modulator 100 is a feedback system, it can become increasingly difficult to stabilize the modulator 100 at high sampling frequencies. This may be due to parasitic poles and any additional delays in the circuit, for example caused by the quantizer 104 and/or DAC 106. Another aspect of the sigma-delta modulator 100 (and also other type of ND converters) is that meta stability of the quantizer 104 can cause errors in the system, particularly for very small input signals 105 to the quantizer 104, which can degrade performance. The (bit) errors occur due to the fact that the feedback signal 107 that goes into the adder 112 is not exactly the same as the output signal 114 that goes through many digital gates and can be considered as an ideal digital signal.

The quantizer 104 can be a particularly important block in a sigma-delta modulator 100 for several reasons. It needs to provide enough gain to enable a digital decision to be made based on a very small signal received from the loop filter 102. Depending on the resolution of the sigma-delta modulator 100 and the specified system bit error rate (BER), the required gain of the quantizer 104 can be for example of the order of $10^7$-$10^8$. However, the delay of the quantizer 104 during the decision making process has a direct impact on the stability of the sigma-delta loop. In practical cases, the delay of the quantizer 104 is usually lower than a sampling period of the clock signal 108. However, for very high speed sigma-delta modulators (for example at 10 GHZ to 20 GHz), the maximum allowable delay time of the quantizer 104 may be only 50 ps. The achievable gain of the quantizer 104 is directly related to the available time budget. Therefore it is increasingly difficult to provide a sufficiently high gain of the quantizer 104 to adequately mitigate meta stability problems, whilst also providing a stable very high-speed sigma-delta modulator 100.

Figure 2A:
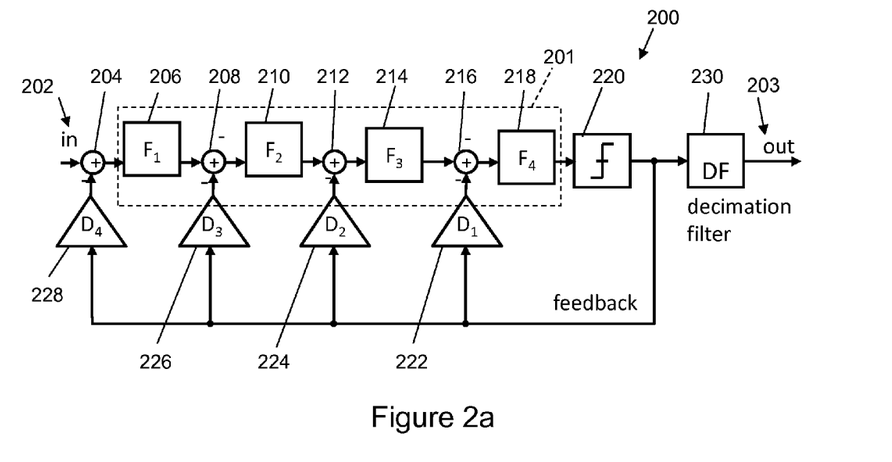
FIG. 2a shows a sigma-delta modulator loop that contains a fourth-order loop filter and 1-bit quantizer (with distributed feedback coefficients)

FIG. 2a shows a block diagram of a sigma-delta modulator loop 200 with a 1-bit quantizer 220, which may also be referred to as a comparator. The quantizer 220 in FIG. 2a is shown as an ideal comparator. Assuming unity, the comparator generates a +1 output level for input signals greater or equal to 0 and a -1 output level for signals smaller than 0. This example contains a fourth-order loop filter 201 built from four first-order filter stages F1-F4 206, 210, 214, 218 with a 1-bit quantizer 220.

A main feedback path (which includes a fourth feedback component D4 228) is defined between the output of the quantizer 220 and the input to the fourth-order loop filter 201. The main feedback path is coupled to the input of the fourth-order loop filter 201 using a main adder 204. The feedback signal is subtracted from the input signal by the main adder 204.

Three additional feedback paths (which include first to third feedback components D1-D3 226, 224, 222) are coupled to intermediate points in the fourth-order loop filter 201 using associated adders 208, 212, 216. The additional feedback paths can stabilise the sigma-delta loop modulator 200. The output of the quantizer 220 is also fed to a digital decimation filter 230, which has a high enough gain such that the output signal (out) 203 of the digital decimation filter 230 can be considered as a true digital signal. Therefore the digital decimation filter 230 can be modelled as an ideal comparator.

The difference between the output signal 203 of the sigma-delta modulator 200 and the feedback signal from the quantizer 220 is called the meta stability error. This meta stability error is due to a limited gain of the quantizer 220. The architecture of FIG. 2a may not be suitable for very high speed sampling as the gain requirement of the quantizer 220 can become extremely difficult to fulfil for sampling speeds of several tens of GHz, for example.

Figure 2B:
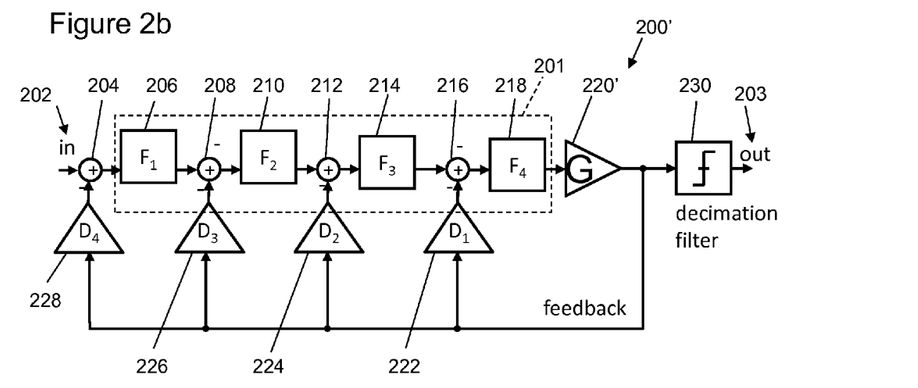
FIG. 2b shows a sigma-delta modulator loop that contains a fourth-order loop filter and 1-bit quantizer modelled as a gain stage with maximum gain G (and limited output levels)

FIG. 2b shows a sigma-delta modulator loop 200' that is similar to the one illustrated as FIG. 2a. FIG. 2b can be considered as illustrating a practical implementation of the ideal modulator of FIG. 2a. Due to the very high gain in the decimation filter 230, the decimation filter 230 is modelled as a perfect comparator and the 1-bit quantizer 220' is modelled as a simple single linear gain G with a high gain value. Again, assuming unity, the maximum and minimum output levels of gain G are limited to +1 and -1 respectively.

One or more examples disclosed herein can provide an acceptable level of meta stability for high-speed or low-power sigma-delta modulators. A distributed quantizer architecture can be used to decouple the quantizer gain requirement (related to the meta stability problem) from the clock speed limitation of the sigma-delta modulator (related to the modulator stability). In this way a sigma-delta modulator can operate at higher speeds or at lower powers without suffering from meta stability problems. It will be appreciated that the speed of operation is related to power consumption.

Figure 3A:
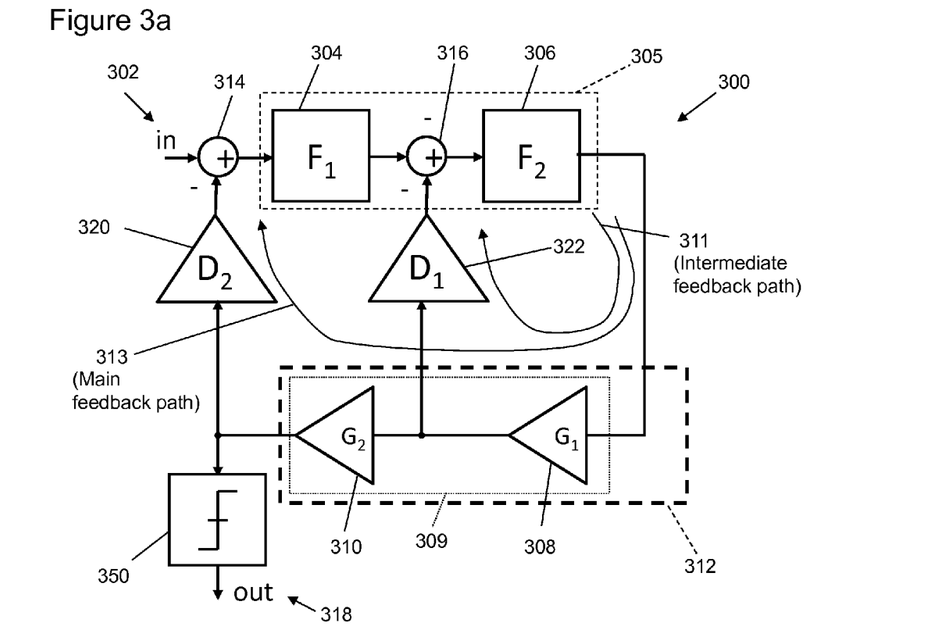
FIGS. 3a and 3b illustrate a sigma-delta modulators with a distributed quantizer architecture.

FIG. 3a illustrates a sigma-delta modulator 300 with a distributed quantizer architecture 312 that can adequately operate at frequencies of the order of 10 to 20 GHz. The sigma-delta modulator 300 includes a first filter stage 304 and a second filter stage 306 in series with each other. The first filter stage 304 and the second filter stage 306 can together be referred to as a loop filter 305.

A first feedback path 311 is defined between the output of the second filter stage 306 and the input to the second filter stage 306. The first feedback path 311 comprises a first gain stage 308 such that the first feedback path 311 is configured to provide a first gain value. In this example the first gain stage comprises a first limiting amplifier G1 308.

A second feedback path 313 is defined between the output of the second filter stage 306 and the input to the first filter stage 304. The second feedback path 313 comprises a second gain stage 309 such that the second feedback path 313 is configured to provide a second gain value. The second gain value is different to the first gain value.

In this example the second gain stage 309 comprises the first limiting amplifier G1 308 and a second limiting amplifier G2 310 in series. In this way, the first limiting amplifier G1 308 of the first feedback path 311 can be reused for the second feedback path 313.

It will be appreciated from the examples that follow that further gain stages could also be included and that the limiting amplifiers G1, G2 308, 310 need not necessarily be in series with each other.

The sigma-delta modulator 300 has an input terminal 302 for receiving an input analogue signal and an output terminal 318 for providing an output digital signal. The input terminal 302 is coupled to a first input of a main adder 314. The main adder 314 is used to receive the second feedback signal 313, which will be referred to as a main feedback signal below. The output of the main adder 314 is coupled to an input of the first filter stage F1 304. The first filter stage F1 304 may be a first order filter, or a higher order filter.

The output of the first filter stage F1 304 is coupled to a first input of an intermediate adder 316. The intermediate adder 316 is used to receive the first feedback signal 311, which will be referred to as an intermediate feedback signal below. The output of the intermediate adder 316 is coupled to an input of the second filter stage F2 306. The output of the second filter stage F2 306 is coupled to an input of the distributed quantizer architecture 312. More specifically, the second filter stage F2 306 is coupled to an input of the first gain stage G1 308.

The output of the first gain stage G1 308 is coupled to the second input of the intermediate adder 316 in order to provide the intermediate feedback signal. In this example, the first input of the intermediate adder 316 is a positive input and the second input is a negative input such that the intermediate adder 316 subtracts the intermediate feedback signal from the signal received from the output of the first filter stage F1 304 in order to provide negative feedback. It will be appreciated that any of the examples disclosed in this document can be implemented with negative or positive feedback, or a combination of the two. In one example, one or more of the feedback paths could be positive for a bandpass sigma-delta modulator.

A first feedback component D1 322 is provided between the output of the first gain stage G1 308 and the second input to the intermediate adder 316. The first feedback component D1 322 can have a transfer function that ensures that the modulator 300 is stable. If the gain of the first gain stage G1 308 is very high such that the output signal of the first gain stage G1 308 is considered to be a digital signal, then the first feedback component D1 322 may be provided as a digital to analogue converter (DAC).

Alternatively, if the gain of the first gain stage G1 308 is low or 1, then the first feedback component D1 322 may be used to provide purely analogue feedback. It will be appreciated by the skilled person that for output signals of the first gain stage G1 308 in between these two extremes, the first feedback component D1 322 can be implemented in such a way as to enable the intermediate feedback signal to be processed correctly.

That is, depending on the gain of G1 308 the implementation of D1 322 might be different, but in such a way that it provides feedback to keep the modulator stable.

The output of the first limiting amplifier G1 308 is also coupled to an input of the second limiting amplifier G2 310. The output of the second limiting amplifier G2 310 is coupled to a second input of the main adder 314 in order to provide the main feedback signal. In a similar way to the intermediate adder 316 discussed above, the main adder 314 can subtract the main feedback signal from the input signal received at the input terminal 302 to provide negative feedback, or the main adder 314 can add the two signals together to provide positive feedback.

A second feedback component D2 320 is provided between the output of the second limiting amplifier G2 310 and the second input to the main adder 314 in order to condition the main feedback signal such that it is suitable for processing by the main adder 314. In this example, the combined gain of the first gain stage G1 308 and the second gain stage G2 310 is very high, for example of the order of $10^7$ or $10^8$, and the second feedback component D2 320 is a DAC.

The first limiting amplifier G1 308 and the second limiting amplifier G2 310 can be high gain amplifiers with limiters. Assuming that the output of the quantizer 312 will be unity, the maximum outputs of first limiting amplifier G1 308 and the second limiting amplifier G2 310 are +/−1. Coefficients of D1 and D2 are applied as weight factors to the outputs of the limiting amplifiers G1, G2 308, 310 by feedback components D1, D2 322, 320. D1 and D2 are used to scale the digital output signals of the limiting amplifiers G1, G2 308, 310. In one example, D1 and D2 have values of 2 and 1 respectively. If the first limiting amplifier G1 308 does not have sufficient gain then the amplitude of the output signal from G1 308 will be smaller than 1 if it receives a small input signal from the output of the second filter stage 306. In that case (because of a not fully settled output of the first limiting amplifier G1 308), the feedback signal through D1 322 is too small and a bit error can occur.

The output of the second gain stage 312 is also coupled to the output terminal 318, in this example via an optional decimation filter 350.

The sigma-delta modulator 300 of FIG. 3 addresses the speed limitations of the architecture of FIG. 2 due to its distributed quantizer 312 architecture, which takes advantage of the realisation that the requirements for the quantizer gain are not necessarily the same for the main feedback path 313 (that includes second feedback component D2 320) and the intermediate feedback path 311 (that includes the first feedback component D1 322). For example, the accuracy of the main feedback path 313 dominantly contributes to the resolution of the overall sigma-delta modulator ADC 300. Therefore, the full quantizer gain requirement applies for the main feedback path 313. That is, the total gain of the quantizer architecture 312 (the sum of the gains of the first limiting amplifier G1 308 and the second limiting amplifier G2 310) should equal the total gain required.

However, it has been found that errors that are made in the intermediate feedback path 311 are suppressed by the gain of the first filter stage F1 304. The gain of the first filter stage F1 304 therefore can be used to reduce the quantizer gain requirements for the intermediate feedback path 311. That is, the gain of the portion of the quantizer architecture 312 that is in the intermediate feedback loop (the first gain stage 308) can be less than the total gain required, without significantly degrading performance. Therefore, the first gain value of the intermediate feedback path 311 is less than the second gain value of the main feedback path 313.

It has also been found that the importance of the speed requirements of the different feedback paths is opposite to the gain requirements. That is, the intermediate feedback path 311 requires the fastest processing as it cannot accommodate as long a time delay as the main feedback path 313, whilst still fulfilling stability requirements. Therefore, a time delay associated with the intermediate feedback path 311 is less than a time delay associated with the main feedback path 313 for FIG. 3a.

These two realisations fit well together as a gain stage with a relatively low gain value typically incurs only a short time delay. Conversely, a gain stage with a relatively high gain value typically incurs a longer time delay. Therefore, these characteristics of gain stages enables the objective of moving the high gain requirements to a distal part of the feedback path, whilst having stringent timing requirements for the proximal part of the feedback path, to be conveniently satisfied by splitting the single gain stage of FIG. 2 into the multiple gain stages G1, G2 308, 310 of FIG. 3a. The outputs of the multiple gain stages can then be used to provide feedback signals at various different nodes in the loop filter 305.

FIG. 3a can be considered as illustrating a sigma-delta modulator 300 comprising a loop filter 305 and a quantizer 312. The loop filter 305 is in a forward path of the sigma-delta modulator 300 and the quantizer 312 is in a feedback path of the sigma-delta modulator 300. The quantizer 312 has a plurality of gain stages G1, G2 308, 310 in series with each other. The outputs of the plurality of gain stages G1, G2 308, 310 are each coupled to different loop filter nodes in the loop filter 305 in order to define a plurality of feedback paths 311, 313 in the sigma-delta modulator 300, wherein each feedback path 311, 313 is configured to provide a different gain. The loop filter nodes are nodes within the loop filter 305 that are before an individual filter stage F1, F2 304, 306. In this way, meta stability errors can be shaped with the filter stages F1, F2 304, 306.

Figure 3B:
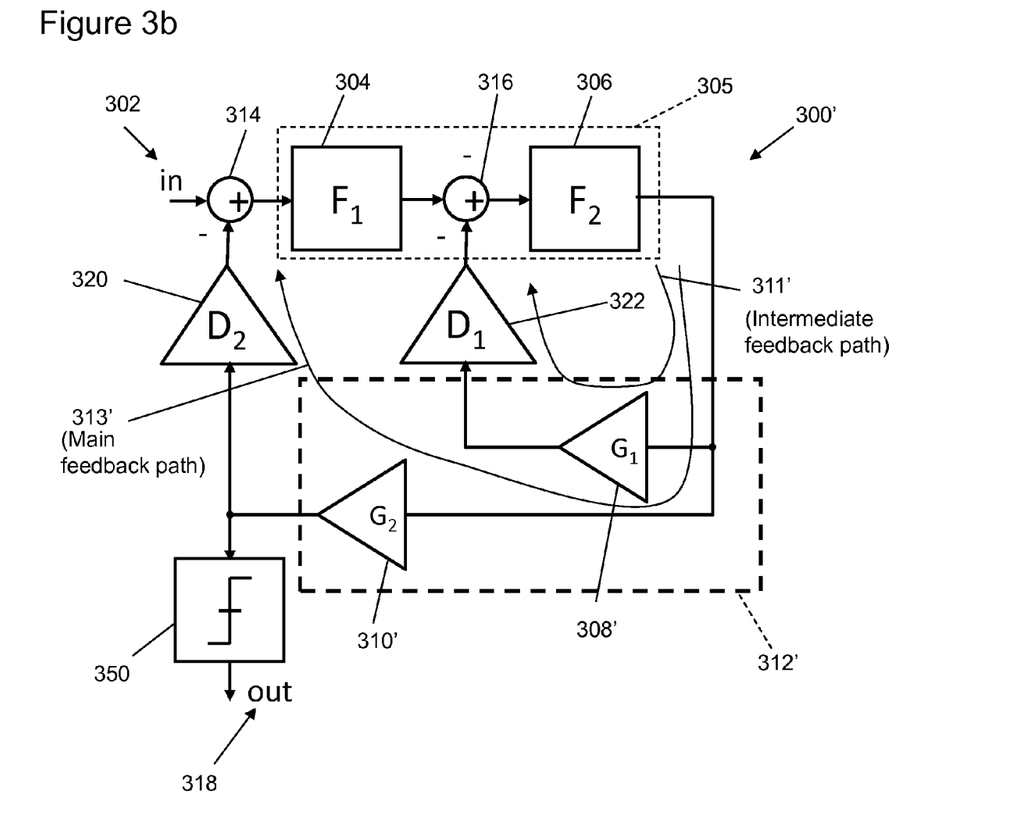

FIG. 3b illustrates another sigma-delta modulator 300'. Features of FIG. 3b that are common to FIG. 3a have been given the same reference number and will not necessarily be described again here. In contrast to FIG. 3a, a limiting gain amplifier is not re-used for the main and the intermediate feedback paths 311', 313'. That is, the gain stages of the first and second feedback paths 311', 313' are independent of each other.

In FIG. 3b, the output of the second filter stage F2 306 is coupled to the input of the first limiting amplifier G1 308'. The output of the first limiting amplifier G1 308' is coupled to the input of the second filter stage F2 306 via the first feedback component D1 322 and the intermediate adder 316 to define the first feedback path 311'. The output of the second filter stage F2 306 is also coupled to the input of the second limiting amplifier G2 310'. The output of the second limiting amplifier G2 310' is coupled to the input of the first filter stage F1 304 via the second feedback component D2 320 and the main adder 314 to define the second feedback path 313'.

Although FIGS. 3a and 3b are described with reference to a single bit feedback signal, it will be appreciated that sigma-delta modulators described in this document can also be used with multi-bit feedback signals. For example, if 4-bit feedback signals are used then 15 separate feedback wires can be used in parallel for each feedback path, with each wire having one or more separate limiting amplifiers.

Figure 4:
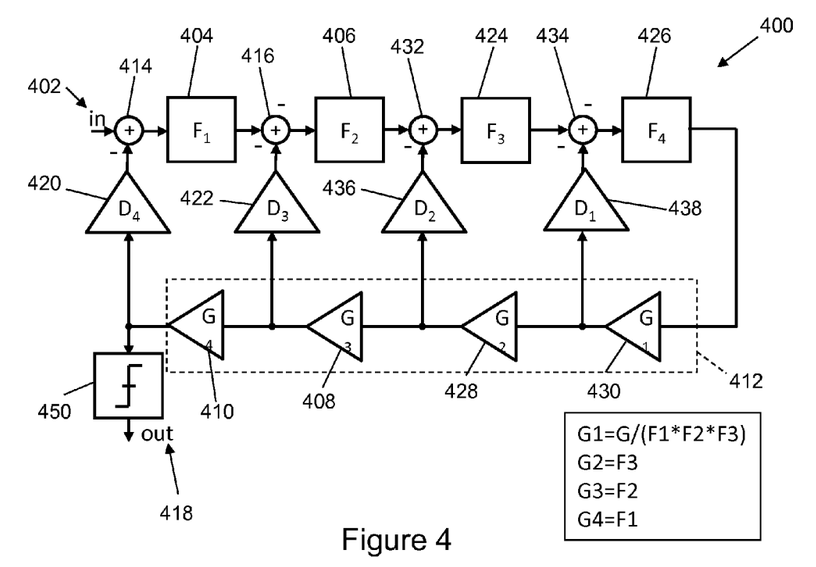
FIG. 4 illustrates another sigma-delta modulator with a distributed quantizer architecture.

FIG. 4 illustrates another sigma-delta modulator 400 with a distributed quantizer architecture 412. In this example the quantizer architecture 412 includes four limiting amplifiers G1, G2, G3, G4 430, 428, 408, 410 in series that are used to provide four gain stages, one for each of four feedback paths. A first gain stage is provided by the first limiting amplifier G1 430. A second gain stage is provided by the combination of the first limiting amplifier G1 430 and the second limiting amplifier G2 428. A third gain stage is provided by the combination of the first limiting amplifier G1 430, the second limiting amplifier G2 428 and the third limiting amplifier G3 408. A fourth gain stage is provided by the combination of the first limiting amplifier G1 430, the second limiting amplifier G2 428, the third limiting amplifier G3 408 and the fourth limiting amplifier G4 410.

Features of FIG. 4 that are common to FIG. 3 will not necessarily be described again here.

The modulator 400 of FIG. 4 includes a main feedback path (through fourth feedback component D4 420) and three intermediate feedback paths (through third feedback component D3 422, second feedback component D2 436, and first feedback component D1 438 respectively). As with the example of FIGS. 3a and 3b, the gain requirements increase through the quantizer architecture 412 from the first limiting amplifier G1 430 to the fourth limiting amplifier G4 410, and the time delay requirements decrease through the quantizer architecture 412 from the first limiting amplifier G1 430 to the fourth limiting amplifier G4 410.

As discussed above in relation to FIGS. 3a and 3b, the accuracy of the main feedback path (which includes D4 420) dominantly contributes to the resolution of the overall sigma-delta modulator ADC 400. Errors that are made in the third feedback path (which includes D3 422) are suppressed by the gain of the first filter stage F1 404. The gain of filter stage F1 404 therefore appropriately reduces the quantizer gain requirements for that particular feedback path, as defined by the sum of the gains of the first limiting amplifier G1 430, the second limiting amplifier G2 428, and the third limiting amplifier G3 408. The same reasoning applies to the quantizer gain requirement of the second feedback path (which includes D2 436), which is effectively reduced by a combination of the gains of first filter stage F1 404 and second filter stage F2 406. The quantizer gain of the second feedback path is defined by the sum of the gains of the first limiting amplifier G1 430 and the second limiting amplifier G2 428. Similar reasoning applies for the first feedback path through D1 438.

FIG. 4 includes a table that illustrates an example of minimum gain requirements for each feedback path that may not cause noticeable performance degradation in the signal band of interest. It will be appreciated from this table that the inner feedback path (which includes D1 438) has the least stringent gain requirement, and that the gain requirements gradually increase to the outer feedback paths with the most stringent gain requirements for the main feedback path (which includes D4 420).

Figure 5:
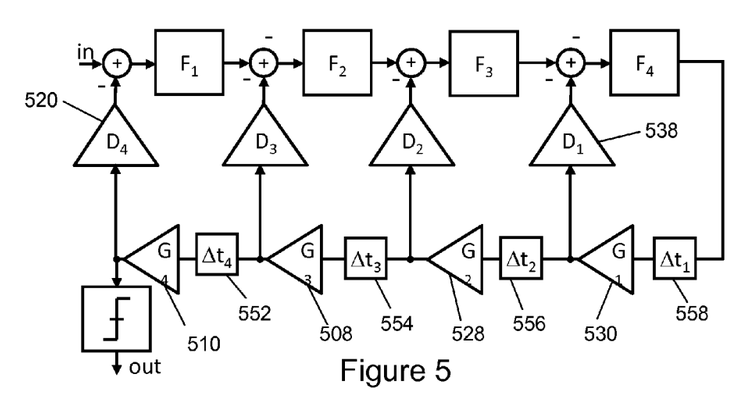
FIG. 5 illustrates the same sigma-delta modulator as FIG. 4 with the inherent time delays of the gain stages shown as separate time delay components.

FIG. 5 illustrates the same sigma-delta modulator as FIG. 4. However, in FIG. 5 the inherent time delays of the limiting amplifiers G1-G4 530, 528, 508, 510 are shown as separate time delay components $\Delta t_1, \Delta t_2, \Delta t_3, \Delta t_4$ 558, 556, 554, 552 in order to assist the description of the latency requirements of each of the gain stages.

As mentioned above, the importance of the speed requirements of the different feedback paths is opposite to the gain requirements, which means that the innermost feedback path (which includes D1 538) requires the least delay in order to fulfil stability requirements, while the delay requirements gradually relax for the outer feedback paths. The main feedback path (which includes D4 520) can tolerate the largest delay, while still maintaining a stable sigma-delta modulator. This is graphically shown in FIG. 5, where for each feedback path from D1 538 to D4 520, additional delay $\Delta t_1$-$\Delta t_4$ 558 552 can be tolerated without seriously affecting the stability of the total system. The amount of delay that can be tolerated in each feedback path depends on the specific design of the modulator. For example, the choice for the comparator gains and delays might impact the coefficients F1-F4 and D1-D4 to achieve optimized performance.

Figure 6:
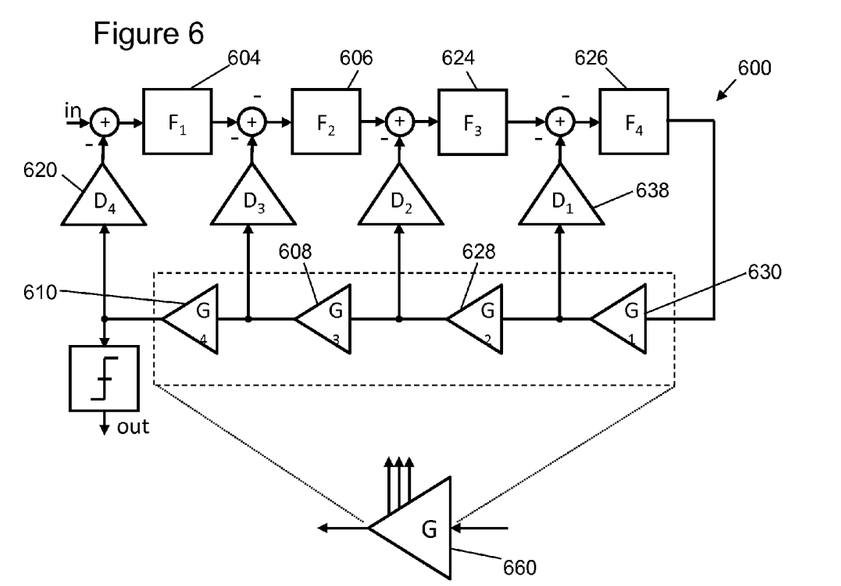
FIG. 6 illustrates a further sigma-delta modulator with a distributed quantizer architecture.

FIG. 6 illustrates a sigma-delta modulator 600 that utilises an inner feedback path (which includes D1 638) that has the lowest gain but highest speed (lowest latency) requirements and an outer feedback path (which includes D4 620) that has the highest gain but lowest speed (highest latency). In this general system concept, the quantizer 660 is represented by a single comparator/gain stage 660 that has intermediate taps to provide feedback paths with different gain values. The single comparator/gain stage 660 is shown as a cascade of limiting amplifiers G1-G4 630, 628, 608, 610 where each limiting amplifier has a certain gain and latency associated with it. The most precise digital representation of the decision performed by the quantizer 660 is taken from the output of the last amplifier stage G4 610 of the quantizer 660, which is considered as the digital output. The meta stability errors that are injected internally in the sigma-delta loop via the feedback paths (which include D1-D4) are suppressed by the gain of one or more of the loop filter stages F1-F4 604, 606, 624, 626 and/or the gain of one or more of the limiting amplifiers G1-G4 630, 628, 608, 610. The innermost feedback path (which includes D1 638) requires the lowest latency, but the least accurate decision. Therefore, the clocking speed of the modulator 600 of FIG. 6 can be much higher than that of FIG. 2 because for FIG. 2 each individual feedback path has the same maximum quantizer gain.

It will be appreciated that four limiting amplifiers are not necessarily required. For example, limiting amplifiers G1-G3 630, 628, 608 may provide enough gain for a specific performance point and limiting amplifier G4 610 can be discarded. In other words, the fourth limiting amplifier G4 610 may be implemented as an amplifier with a gain of 1, for example a simple electrical connection (such as a wire) may be sufficient to complete the feedback path between the output of the third limiting amplifier G3 608 and the input to the fourth feedback component D4 620. Optionally, one or more of the intermediate limiting amplifiers (G1 630, G2 628, G3 608) can be discarded in the same way if stricter speed requirements are required for a particular inner loop.

In other examples, one or more of the limiting amplifiers could be bypassed to provide the required gain stages. For example, the output of the second limiting amplifier G2 628 could be connected to the input to the second feedback component D2 (as shown in FIG. 6), but not be connected to the input of the third limiting amplifier G3 608. Instead, the output of the first limiting amplifier G1 630 could be connected to the input of the third limiting amplifier G3 608. That is, a modulator can include a combination of series connections of limiting amplifiers (as shown in FIG. 3a) and non-series connections of limiting amplifiers (as shown in FIG. 3b).

Figure 7:
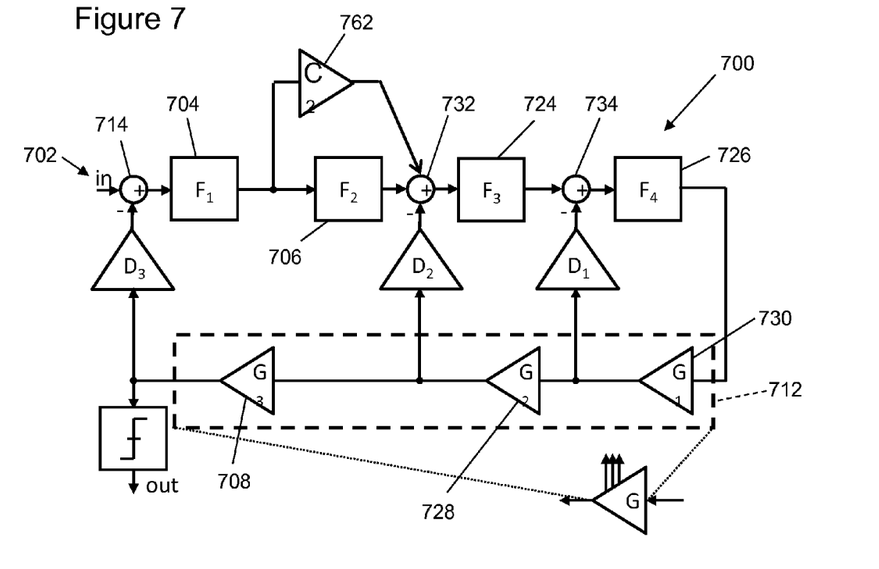
FIG. 7 illustrates a further still sigma-delta modulator with a distributed quantizer architecture.

FIG. 7 illustrates another sigma-delta modulator 700. In this example, four filter stages F1-F4 704, 706, 724, 726 are used. Three feedback paths and one feedforward path are provided, as described below.

The quantizer 712 in this example comprises three limiting amplifiers: a first limiting amplifier G1 730, a second limiting amplifier G2 728 and a third limiting amplifier G3 708. The first limiting amplifier G1 730 forms part of a first feedback loop that is coupled to an intermediate adder 734 between the third filter stage F3 724 and the fourth filter stage F4 726. The series combination of the first limiting amplifier G1 730 and the second limiting amplifier G2 728 forms part of a second feedback loop that is coupled to an intermediate adder 732 between the second filter stage F2 706 and the third filter stage F3 724. The series combination of the first limiting amplifier G1 730, the second limiting amplifier G2 728 and the third limiting amplifier G3 708 forms part of a third/main feedback loop that is coupled to a main adder 714 between the input terminal 702 and the first filter stage F1 704.

The feedforward path is provided between the output of the first filter stage F1 704 and the intermediate adder 732 between the second filter stage F2 706 and the third filter stage F3 724. The feedforward path includes an optional feedforward component C2 762 that is connected between the output of the first filter stage F1 704 and either a positive or negative input to the intermediate adder 732, thereby providing either positive or negative feedforward control.

It will be appreciated that any number of feedback paths and any number of feedforward paths can be used in any of the sigma-delta modulators disclosed herein.

For the configurations of each of FIGS. 3 to 7, meta stability errors can be tolerated in the system without causing severe degradation of the overall performance and this approach makes it possible to clock the sigma-delta modulator at a much higher rate and/or to operate it at lower powers compared to the system of FIG. 2.

Applications of one or more of the sigma-delta modulators disclosed herein include:
  wideband receivers for cellular applications, including car radio applications;
  base stations;
  ultra wideband applications;
  wideband television reception;
  connectivity;
  software defined radio/cognitive radio;
  any other application that can benefit from a high or ultra-high frequency sigma-delta architecture; and
  low-power applications.

Examples described herein can be considered as sigma-delta modulator topologies with a comparator/quantizer that consists of more than one gain stage, where the outputs of the comparator/quantizer gain stages (which have different levels of meta stability errors) are distributed to different loop filter nodes of the sigma-delta modulator, to shape the meta stability errors with the loop filter stages.

It will be appreciated that features described in relation to one example may be provided in addition to the features illustrated in any other example, unless an intention to the contrary is apparent.

Terms such as "steep", "rapid", "large", "small", "high", "low", etc. used herein can be considered as greater than a threshold value, less than a threshold value, or between two threshold values depending upon the context.

Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. A sigma-delta modulator comprising:
  a first filter stage;
  a second filter stage in series with the first filter stage;
  a first feedback path between the output of the second filter stage and the input to the second filter stage, the first feedback path comprising a first gain stage such that the first feedback path is configured to provide a first gain value; and
  a second feedback path between the output of the second filter stage and the input to the first filter stage, the second feedback path comprising a second gain stage such that the second feedback path is configured to provide a second gain value;
  wherein the first gain value is different from of the second gain value; and
wherein the sigma-delta modulator further comprises:
  an output terminal;
  wherein output of the second gain stage is coupled to the output terminal.

2. The sigma-delta modulator of claim 1, wherein the first gain value is less than the second gain value.

3. The sigma-delta modulator of claim 1, wherein a time delay associated with the first feedback path is less than a time delay associated with the second feedback path.

4. The sigma-delta modulator of claim 1, wherein the first gain stage comprises a first limiting amplifier, and the second gain stage comprises the first limiting amplifier and a second limiting amplifier in series.

5. The sigma-delta modulator of claim 4, wherein the gain of the second limiting amplifier is greater than the gain of the first limiting amplifier.

6. The sigma-delta modulator of claim 1, wherein the first gain stage is independent of the second gain stage.

7. The sigma-delta modulator of claim 1, wherein the second gain value is an order of magnitude greater than the first gain value.

8. The sigma-delta modulator of claim 1, wherein the first gain value is 1.

9. The sigma-delta modulator of claim 1, wherein the first feedback path and the second feedback path are configured to provide negative feedback.

10. The sigma-delta modulator of claim 1, further comprising:
  an input terminal;
  a main adder having a first input, a second input and an output;
  an intermediate adder having a first input, a second input and an output; and
  wherein:
    the input terminal is coupled to the first input of the main adder;
    the output of the main adder is coupled to an input of the first filter stage;
    the output of the first filter stage is coupled to the first input of the intermediate adder;
    the output of the intermediate adder is coupled to an input of the second filter stage;
    the output of the second filter stage is coupled to an input of the first gain stage;
    the output of the first gain stage is coupled to the second input of the intermediate adder;
    the output of the second filter stage is also coupled to an input of the second gain stage;
    the output of the second gain stage is coupled to the second input of the main adder; and
    the output of the second gain stage is also coupled to the output terminal.

11. The sigma-delta modulator of claim 1, wherein the second feedback path comprises a second feedback component coupled between the output of the second gain stage and the input of the first filter stage.

12. The sigma-delta modulator of claim 11, wherein the second feedback component is a digital to analogue converter.

13. The sigma-delta modulator of claim 1, wherein the first feedback path comprises a first feedback component coupled between the output of the first gain stage and the input of the second filter stage.

14. A sigma-delta modulator comprising a loop filter in a forward path of the sigma-delta modulator and a quantizer in a feedback path of the sigma-delta modulator, the quantizer having a plurality of gain stages, wherein the outputs of the plurality of gain stages are each coupled to different loop filter nodes in the loop filter in order to define a plurality of feedback paths in the sigma-delta modulator, wherein each feedback path is configured to provide a different gain; and
  wherein a first gain stage in the plurality comprises a first limiting amplifier, and a second gain stage in the plurality comprises the first limiting amplifier and a second limiting amplifier in series.

15. An integrated circuit comprising the sigma-delta modulator of claim 1.

* * * * *